United States Patent
Martinez et al.

(10) Patent No.: US 8,264,211 B2
(45) Date of Patent: Sep. 11, 2012

(54) PROGRAMMABLE POWER LIMITING FOR POWER TRANSISTOR SYSTEM

(75) Inventors: Robert Martinez, Lucas, TX (US);
Richard K. Stair, Knoxville, TN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/124,279

(22) Filed: May 21, 2008

(65) Prior Publication Data

US 2009/0001948 A1    Jan. 1, 2009

Related U.S. Application Data

(60) Provisional application No. 60/946,904, filed on Jun. 28, 2007.

(51) Int. Cl.
*G05F 1/00* (2006.01)
(52) U.S. Cl. ......... 323/282; 323/283; 323/284; 323/285
(58) Field of Classification Search .......... 323/271, 323/273–277, 282, 284, 285, 288, 351, 242, 323/326, 222, 283; 363/21, 89
See application file for complete search history.

(56) References Cited

U.S. PATENT DOCUMENTS

| | | | | |
|---|---|---|---|---|
| 3,619,720 A * | 11/1971 | Coberley | | 361/86 |
| 4,156,837 A | 5/1979 | Baker | | |
| 5,134,537 A * | 7/1992 | Buss et al. | | 361/154 |
| 5,995,386 A | 11/1999 | John et al. | | |
| 6,057,728 A * | 5/2000 | Igarashi | | 327/546 |
| 6,211,746 B1 * | 4/2001 | Segawa et al. | | 331/143 |
| 6,356,466 B1 * | 3/2002 | Smidt et al. | | 363/21.17 |
| 6,573,693 B2 * | 6/2003 | Okamoto | | 323/273 |
| 7,615,977 B2 * | 11/2009 | Gicquel et al. | | 323/273 |
| 7,839,201 B2 * | 11/2010 | Jacobson | | 327/513 |
| 2007/0132502 A1 * | 6/2007 | Kollner et al. | | 327/427 |
| 2008/0272741 A1 * | 11/2008 | Kanamori | | 320/137 |

* cited by examiner

*Primary Examiner* — Adolf Berhane
*Assistant Examiner* — Emily Pham
(74) *Attorney, Agent, or Firm* — William B. Kempler; Wade J. Brady, III; Frederick J. Telecky, Jr.

(57) ABSTRACT

Various systems, methods and apparatuses are provided herein for limiting power dissipation in a switch. As one example, a method for limiting power dissipation is disclosed. The method includes monitoring current through the switch, and based at least in part on detecting that the current is at least as great as a predetermined current limit, regulating the current to the predetermined current limit. The method also includes measuring an amount of power dissipated in the switch while the current is being regulated, and opening the switch when the amount of power has reached a predetermined power limit.

10 Claims, 4 Drawing Sheets

PROGRAMMABLE POWER LIMITING FOR POWER TRANSISTOR SYSTEM

CROSS REFERENCE TO RELATED APPLICATION

The present application claims priority to (i.e., is a non-provisional of) U.S. Pat. App. No. 60/946,904 entitled "Programmable Power Limiting for Power Transistor System", and filed Jun. 28, 2007 by Martinez et al. The aforementioned application is assigned to an entity common hereto, and the entirety of the aforementioned application is incorporated herein by reference for all purposes.

BACKGROUND OF THE INVENTION

The present invention is related to limiting power dissipation in a switch, and in particular to programmable power limiting for a power transistor system.

Power supplies used in electronic devices often include power transistor systems that may be used to limit the electrical current to the devices or even to disconnect the power from the devices in the event of current overload. This current limitation protects the electronic devices from being damaged by a current overload. However, current limitation does not protect the switch transistors themselves in all situations. System capacitance and inductance in an electronic device, including for example the parasitic inductance in power cables, can cause a large inrush current when the device is first connected to power. Other problems in the system such as short circuits may also cause excessive current to flow through the system over time. Even if the current is limited to protect the electronic device and does not exceed the maximum current limit of the system, the power transistors used to limit the current may overheat if excessive power is dissipated in them during these high current conditions. This can cause physical damage to the power transistors and permanent system failure.

Hence, for at least the aforementioned reasons, there exists a need in the art for systems and methods for limiting power dissipated in a power transistor system.

BRIEF SUMMARY OF THE INVENTION

The present invention is related to limiting power dissipation in a switch, and in particular to programmable power limiting for a power transistor system.

Some embodiments of the present invention provide apparatuses for limiting power dissipation. The apparatus may include a switch having a power supply input, a load power output, a switch control input, a current level output and a voltage level output. The apparatus may also include a current regulator having a switch current level input, a current regulation output, a power meter enable output and a power shutoff input. The switch current level input is connected to the current level output from the switch and the current regulation output is connected to the switch control input. The apparatus may also include a power meter having a switch voltage level input, an enable input and a power shutoff output. The switch voltage level input is connected to the voltage level output from the switch, the enable input is connected to the current regulator power meter enable output, and the power shutoff output is connected to the current regulator power shutoff input.

Other embodiments of the present invention provide methods for limiting power dissipation in a switch. A method may include monitoring current through the switch, and based at least in part on detecting that the current is at least as great as a predetermined current limit, regulating the current to the predetermined current limit. The method may also include measuring an amount of power dissipated in the switch while the current is being regulated and opening the switch when the amount of power has reached a predetermined power limit.

Yet other embodiments of the present invention provide systems for limiting power dissipation. The systems may include a portable computer and an AC adapter that is connectable to a power supply input on the portable computer, the portable computer having a power supply and a power distribution network connected to an output of the power supply. The power supply includes an adapter control system and a battery, with the battery being switchably connected to the power supply output. The adapter control system includes a switch having a power input, a power output and a switch control input, with the power input being connected to the power supply input. The adapter control system also includes a current monitor, voltage monitor, reference current amplifier, current regulator, power meter, latch, delay circuit and break-before-make circuit. The current monitor includes a current sense resistor and a differential amplifier. The current sense resistor has an input and an output, the input being connected to the switch power output and the output being connected to the power supply output. The differential amplifier has a first input and a second input, the first input being connected to the current sense resistor input and the second input being connected to the current sense resistor output. The voltage monitor includes a differential amplifier having a first input and a second input, the first input being connected to the switch power input and the second input connected to the switch power output. The reference current amplifier has a maximum current limit and has an input connected to a user-supplied current reference level. The current regulator has a current regulation output, a first current input, a second current input, a power meter enable output and a switch enable input. The current regulation output is connected to the switch control input, the first current input is connected to an output of the current monitor, and the second current input is connected to an output of the reference current amplifier. When the switch enable input is inactive the current regulation output is configured to open the switch. The power meter includes a capacitor, a controlled current source, a current sink, a comparator and a reference voltage source. The controlled current source has a control input connected to an output of the voltage monitor differential amplifier. The controlled current source generates an output current that is proportional to a voltage detected by the voltage monitor. The controlled current source has an enable input connected to the current regulator power meter enable output. The capacitor is connected to an output of the controlled current source and to the current sink. The current sink has a disable input connected to the current regulator power meter enable output. The capacitor is also connected to a first input of the power meter comparator, and the reference voltage source is connected to a second input of the power meter comparator. The latch has an input and an output, with the input connected to an output of the power meter comparator. The delay circuit has an input and an output, with the input connected to the latch output. The break-before-make circuit has an input connected to the delay circuit output, an output connected to the current regulator switch enable input and a connection to a battery switch. The break-before-make circuit prevents the adapter control system switch and the battery switch from connecting to the power distribution network simultaneously.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
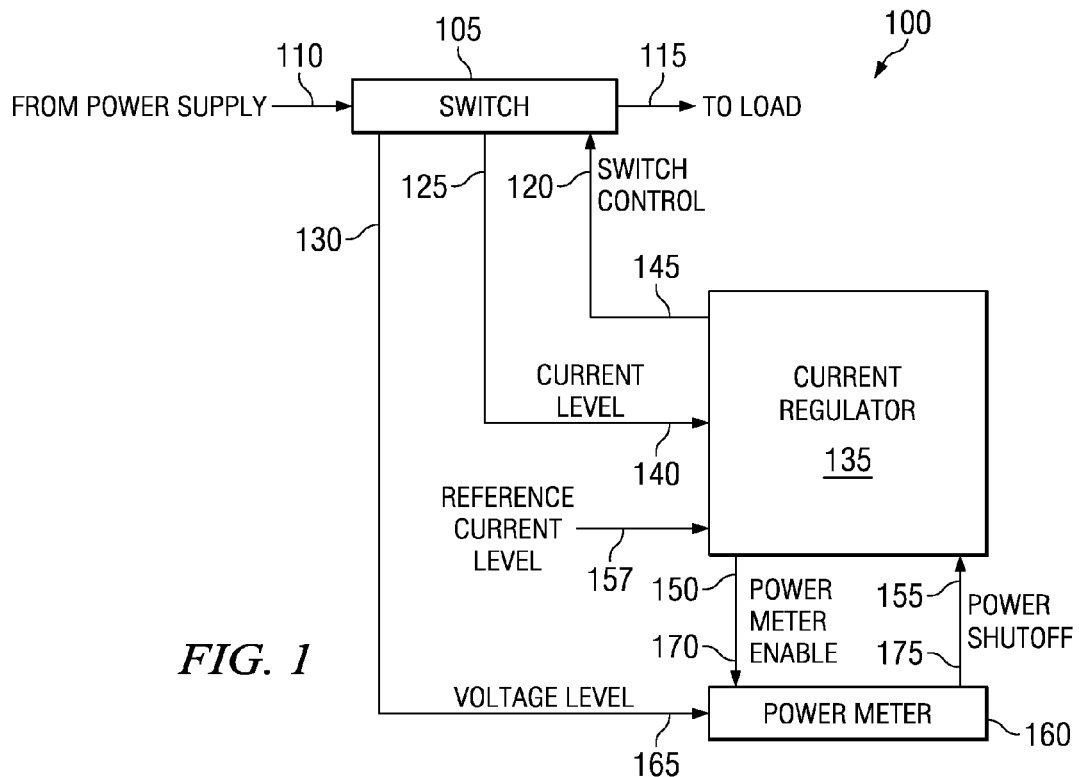
FIG. 1 is a block diagram of a system and apparatus for limiting dissipation of power in a switch.

The present invention is related to limiting power dissipated in a switch, and in particular to monitoring and limiting current and power dissipation in a power supply switch.

Some embodiments of the present invention provide methods for limiting power dissipated in a switch. One method includes monitoring current through the switch, and based at least in part on detecting that the current is at least as great as a predetermined current limit, regulating the current to the predetermined current limit. The method also includes measuring an amount of power dissipated in the switch while the current is being regulated and opening the switch when the amount of power has reached a predetermined power limit. As used herein, the term "switch" is used in its broadest sense to mean any structure for connecting and disconnecting one electrical node from another, or for conducting and interrupting electrical current from one electrical node to another. Thus, as just one example, the switch referred to herein may be a transistor such as a metal oxide semiconductor field-effect transistor (MOSFET). The power supply input may also refer to any input for conducting electricity into a circuit and may be connected to any source of power. As one example, the power supply input may be connected to a direct current (DC) electrical signal from an alternating current (AC) adapter.

In one particular instance of the embodiments, the power dissipated in the switch is measured by accumulating a charge on a capacitor with a current that is proportional to the amount of voltage across the switch during the time that current is being regulated at the predetermined current limit, and comparing the voltage on the capacitor with a reference voltage level.

In yet another instance of the embodiments, the capacitor may be discharged when the current is not being regulated.

The present invention thus measures the current through the switch and the voltage across the switch. During an overload condition, the current is limited to some predetermined value. Simultaneously, a current source that is proportional to the voltage across the switch is used to charge a capacitor. A comparator compares the voltage on the capacitor to a reference voltage, and when the voltage on the capacitor exceeds the reference voltage, the switch is turned off. This disconnects power from the system and protects the device, including the switch, from damage. If the overload condition disappears before the voltage on the capacitor exceeds the reference voltage, the capacitor is slowly discharged. This allows a cumulative effect of multiple overload conditions that are close together in time to be monitored, preventing the switch from overheating from multiple faults.

The system, apparatus and method disclosed herein emulate a calculation of power dissipated in the switch over time by accumulating or integrating an amount of charge proportional to the voltage on the switch during the time that the current is being regulated by the switch. The regulated current will be held at the current limit, and the voltage may vary over time on the switch but is accounted for by the accumulating charge on the capacitor. The power dissipated in the switch is equal to the current through the switch times the voltage across the switch. The value of the capacitor may be selected to set a desired period of time over which a given amount of power may be dissipated in the switch before the switch is opened to prevent overheating.

Turning to FIG. 1, an apparatus for programmably limiting power dissipation in a power transistor system will be described. For example, the apparatus may be an AC adapter control system 100 that switches power from an AC adapter to a load. The adapter control system 100 includes a switch 105 having a power supply input 110, a load power output 115, a switch control input 120, a current level output 125 and a voltage level output 130. A power supply such as an AC adapter is connected to the power supply input 110, and the switch 105 connects and disconnects the power from the AC adapter to a load on the load power output 115. The adapter control system 100 also includes a current regulator 135 having a switch current level input 140, a current regulation output 145, a power meter enable output 150 and a power shutoff input 155. The current regulation output 145 may also include a reference current input 157. The switch current level input 140 is connected to the current level output 125 from the switch 105 and the current regulation output 145 is connected to the switch control input 120. The adapter control system 100 also includes a power meter 160 having a switch voltage level input 165, an enable input 170 and a power shutoff output 175. The switch voltage level input 165 is connected to the voltage level output 130 from the switch 105, the enable input 170 is connected to the current regulator power meter enable output 150, and the power shutoff output 175 is connected to the current regulator power shutoff input 155. The current regulator 135 monitors the current through the switch 105 and limits the current to the level indicated by the reference current input 157. The current regulator 135 asserts the power meter enable output 150 when current is being regulated, causing the power meter 160 to monitor the power dissipated in the switch 105 based on the switch voltage level input 165. If the power being dissipated exceeds a given level, the power meter 160 asserts the power shutoff input 155, causing the current regulator 135 to turn off the switch 105.

Figure 2:
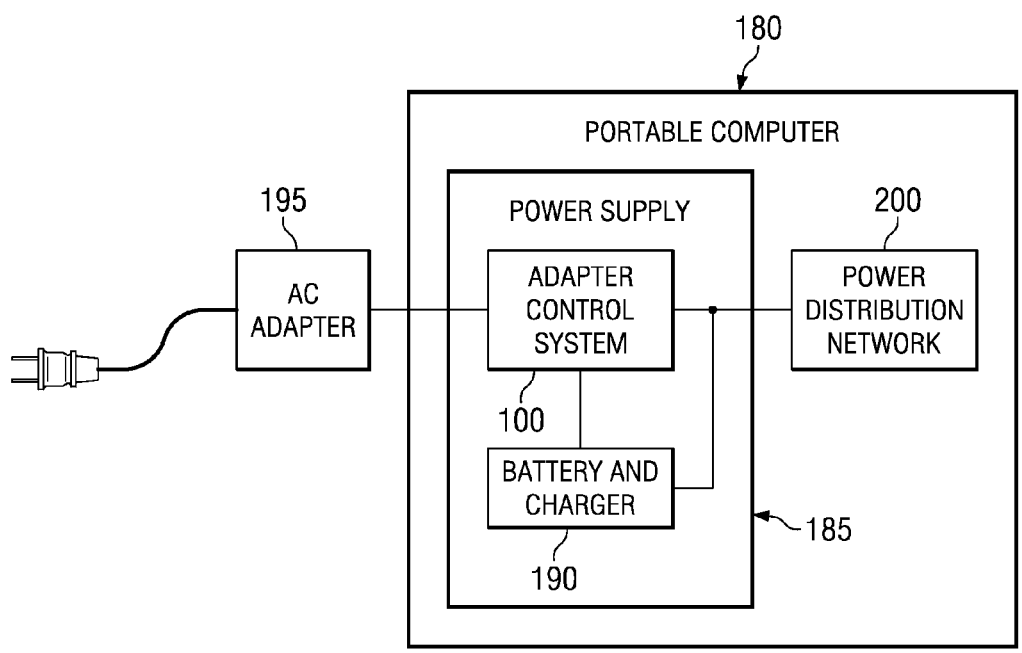
FIG. 2 is a block diagram of a portable computer that may include a system and apparatus for limiting dissipation of power in a switch.

The adapter control system 100 may be used in any electronic device, such as the portable computer 180 illustrated in FIG. 2. The portable computer 180 has a power supply 185 including the adapter control system 100 and a battery and charger 190. The power supply 185 may receive power from any suitable source, such as an external AC adapter 195 that converts AC current from an electrical outlet to DC current that is used by the portable computer 180. A power distribution network 200 in the portable computer 180 distributes power from the power supply 185 to the various components of the portable computer 180 such as a motherboard, display, peripherals, etc. Power may be supplied to the power distribution network 200 from the AC adapter 195 through the adapter control system 100 or from the battery and charger 190. As will be discussed below, one particular embodiment of the adapter control system 100 ensures that the AC adapter 195 and battery and charger 190 are not simultaneously connected to the power distribution network 200.

Figure 3:
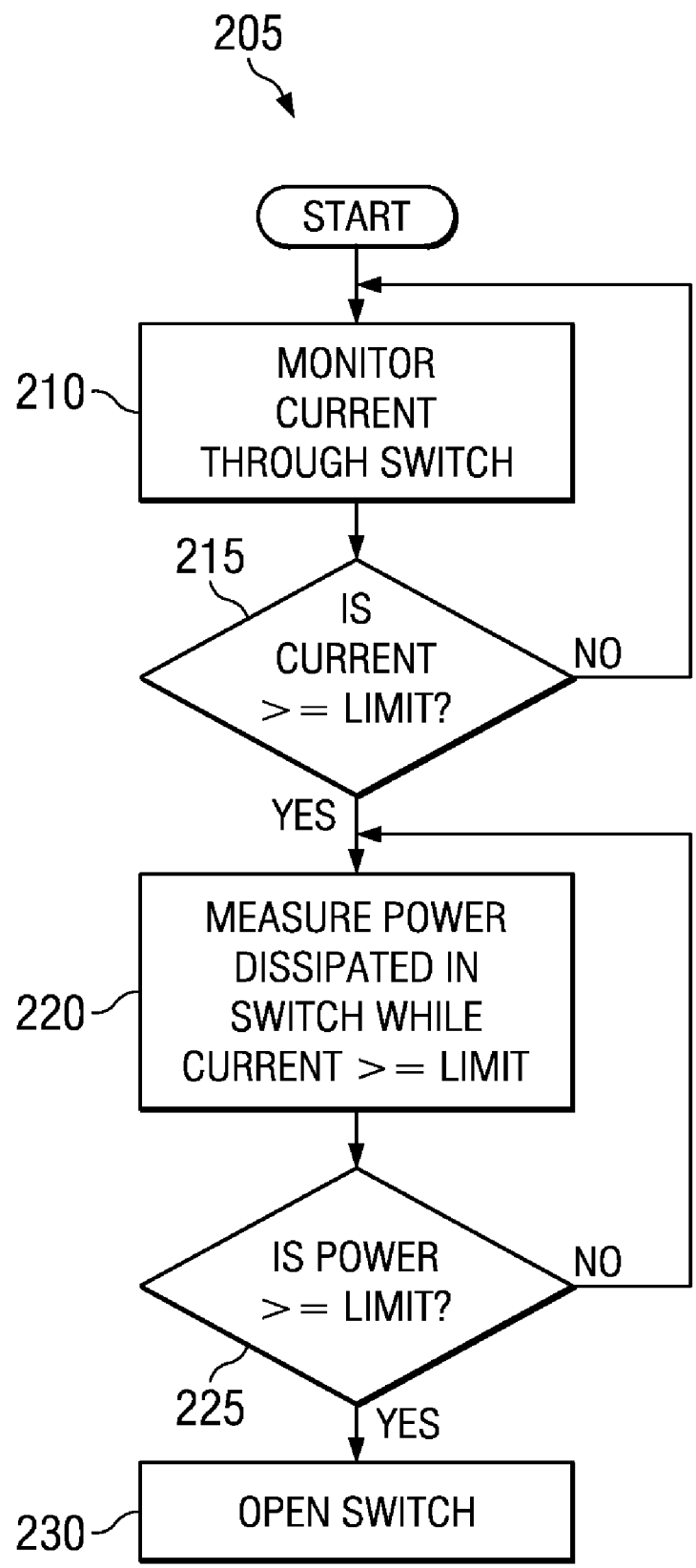
FIG. 3 is a flow chart of an exemplary operation for limiting power dissipation in a switch.

Turning now to FIG. 3, a flow diagram 205 illustrates a method for limiting power dissipation in accordance with various embodiments of the present invention. Following flow diagram 205, current flowing through the switch (e.g., 105) is monitored (block 210). The current is checked to determine whether it has reached a current limit (block 215). For example, the current may be compared with a reference current to determine whether the current through the switch is as great as the reference current. Note that in one particular embodiment, the current through the switch is limited and cannot exceed the current limit or reference current, although in other embodiments the current through the switch may able to exceed the reference current for various reasons. If the current through the switch reaches or exceeds the current limit, the power dissipated in the switch is measured for as long as the current remains at or above the current limit (block 220). The power dissipated in the switch is checked to determine whether it has reached a power limit (block 225). If the power dissipated in the switch in a given time period exceeds the power limit, the switch is opened (block 230). As will be described in more detail below, the power limit is used to limit the amount of power dissipated in the switch over a short period of time, rather than limiting the total amount of power that may be dissipated in the switch as long as it operates. Thus, the switch will be opened if too much power is dissipated in the switch in a short period of time to prevent the switch from overheating. However, the switch has no limit on the amount of time it can operate at lower power levels.

Figure 4:
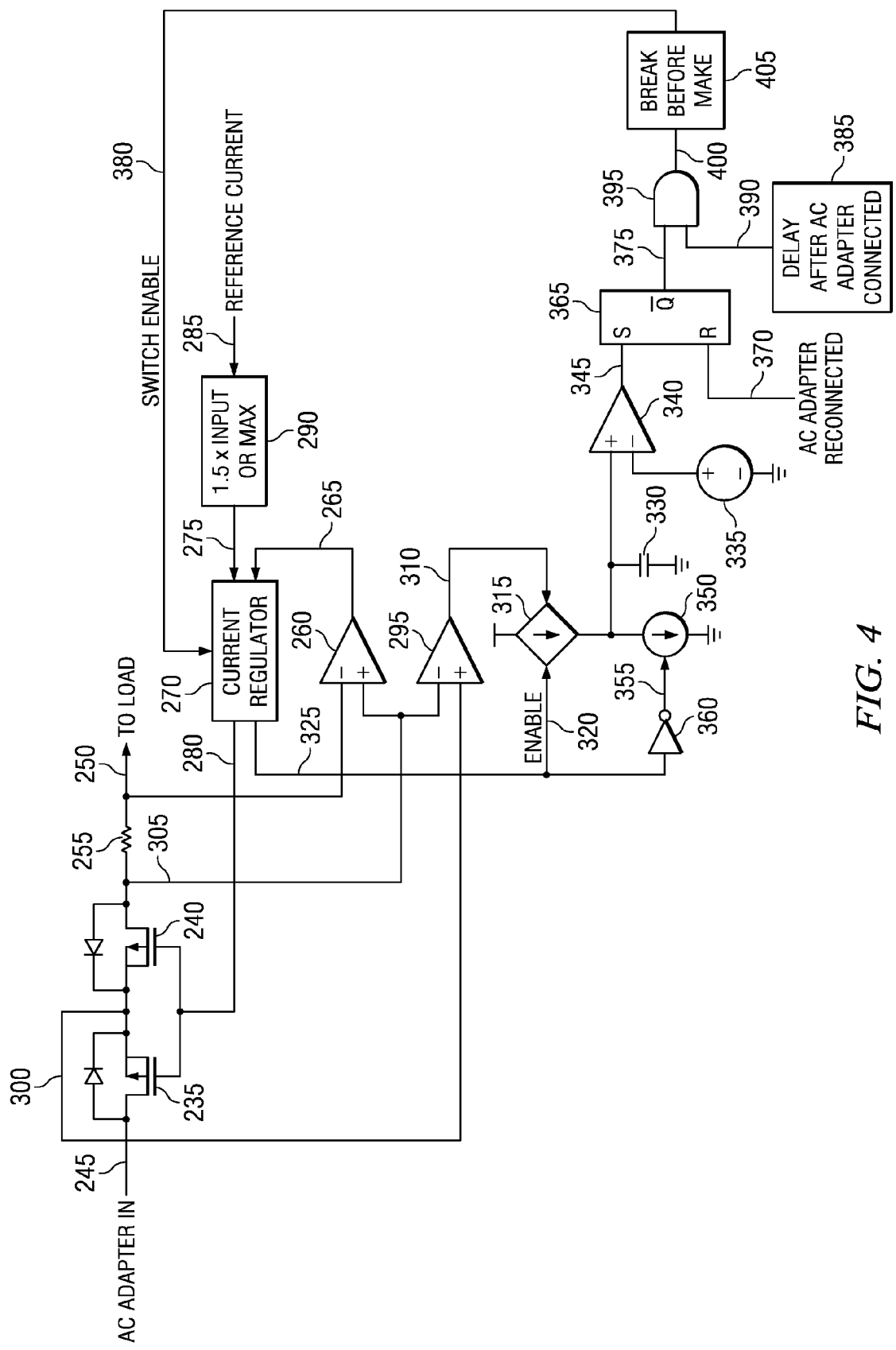
FIG. 4 is a schematic diagram of a system and apparatus for limiting dissipation of power in a switch.

Turning now to FIG. 4, an apparatus for limiting power dissipation is depicted in more detail. A pair of p-channel MOSFET power transistors 235 and 240 correspond with the switch 105 of previous embodiments to pass or block current from an AC adapter input 245 to a load output 250. As discussed above, any suitable device may be used to perform this switching function, and the apparatus for limiting power dissipation is not limited to use with the exemplary MOSFET power transistors. Similarly, another embodiment may contain a single transistor rather than the source-coupled pair 235 and 240 illustrated in FIG. 4, which are included to provide reverse discharge protection from a battery also connected to the load. The term "switch" as used herein may refer to just one of the MOSFETs (e.g., 240) in this embodiment or both (e.g., 235 and 240) taken together.

A current sense resistor 255 is used to monitor the current through the MOSFET power transistors 235 and 240. The current sense resistor 255 may be placed in series between the AC adapter input 245 and the load output 250, such as immediately after the MOSFET power transistors 235 and 240 as illustrated in FIG. 4. A differential amplifier 260 is used to measure the voltage drop across the current sense resistor 255 and generate a voltage on the output 265 that is proportional to the current through the MOSFET power transistors 235 and 240. The differential amplifier 260 thus has two inputs, one connected to the input and the other connected to the output of the current sense resistor 255. The voltage on the output 265 of the differential amplifier 260 is provided to a current regulator 270 that controls the MOSFET power transistors 235 and 240. The current regulator 270 also receives a reference current 275 that is compared with the current through the MOSFET power transistors 235 and 240 as reported by the output 265 of the differential amplifier 260. The reference current 275 sets a limit above which the MOSFET power transistors 235 and 240 are not allowed to go. During normal operation, as long as the current through the MOSFET power transistors 235 and 240 is less than the reference current 275, the current regulator 270 leaves the gates of the p-channel MOSFET power transistors 235 and 240 low or inactive, allowing current to flow freely through them from the AC adapter input 245 to the load output 250. If the current increases to the limit set by the reference current 275, the current regulator 270 begins to apply a voltage to the gates of the MOSFET power transistors 235 and 240 through its current regulation output 280, thus restricting the current through the MOSFET power transistors 235 and 240 to the limit set by the reference current 275. As will be described in more detail below, if the power dissipated in the MOSFET power transistors 235 and 240 becomes too great, the current regulator 270 applies a voltage to the gates of the MOSFET power transistors 235 and 240 that fully opens the transistors and shuts off the current. The current regulator 270 may include any suitable circuitry to compare the current inputs 265 and 275 and to generate the appropriate output 280 as described herein. For example, a differential amplifier and driver may be used with an enable input to shut off the output in the event of an over-power condition.

The reference current 275 may be configured by a user-supplied reference current 285. In this case, a reference current amplifier 290 with a maximum current limit may be used to increase the user-supplied reference current 285 to prevent current transients from limiting the steady-state current below that desired by the user. The reference current amplifier 290 multiplies the user-supplied reference current 285 by a particular gain factor such as 1.5, up to a maximum current of, for example, 10 amps (A). As mentioned above, the current regulator 270 bases the current monitoring and regulation on voltage inputs and outputs, and the reference current is provided as a voltage level proportional to the desired current. In other embodiments, current level may be used rather than voltages by providing current mirrors and comparators, etc. rather than differential amplifiers. In one embodiment, the current sense resistor 255 is a 10 milliohm (mΩ), 1%, 1 watt (W) resistor. For a maximum current of 10 A through the MOSFET power transistors 235 and 240, a 100 millivolt (mV) signal is applied to the reference current input 275 of the current regulator 270. However, resistors of other values may also be used. A larger sense-resistor value yields a larger sense voltage, and a higher regulation accuracy, at the expense of a higher conduction loss.

Having described the current monitoring and regulation aspect of the apparatus for limiting power dissipation, the power monitoring and regulation will now be described. A differential amplifier 295 measures the voltage drop across the switch for use in determining the power dissipation in the switch. In this particular embodiment, the differential amplifier 295 measures the voltage drop across MOSFET power transistor 240 by comparing the voltage at the source 300 with the voltage at the drain 305. The output 310 of the differential amplifier 295 is used to control the current from a controlled current source 315. The current produced by the controlled current source 315 is thus proportional to the voltage drop across the MOSFET power transistor 240. The controlled current source 315 also includes an enable input 320 that is connected to a status output 325 of the current regulator 270. The status output 325 is asserted by the current regulator 270 only when the current through the MOSFET power transistors 235 and 240 is being regulated, that is, when the current has reached the limit set by the reference current 275. Thus, the controlled current source 315 only produces an output current when the system is in an overcurrent situation and current is being regulated. The current from the controlled current source 315 is used to charge a capacitor 330 while current through the MOSFET power transistors 235 and 240 is being regulated. The time it takes for the controlled current source 315 to accumulate enough charge on the capacitor 330 to reach a given voltage is dependent on the value of the capacitor 330 and the voltage drop across the MOSFET power transistor 240. Charging the capacitor 330 with a current that is proportional to the voltage drop $V_{sd}$ across the MOSFET power transistor 240 while the current $I_d$ through the MOSFET power transistor 240 is limited at a known value performs the power calculation $P=I_d*V_{sd}$. The capacitor 330 provides a predictable and programmable time to limit the power dissipated in the MOSFET power transistors 235 and 240. For example, in this particular embodiment the capacitor 330 is allowed to charge to 2 volts (V) before the current regulator 270 turns off the MOSFET power transistors 235 and 240 and stops the current. The controlled current source 315 in this particular embodiment produces a current at a ratio of 18 microamps (µA) per volt from the differential amplifier 295, which is equal to the source-to-drain voltage $V_{sd}$ across the MOSFET power transistor 240. The time it takes for the capacitor 330 to charge to the 2 volt limit may therefore be calculated as $\Delta t=(C*\Delta V)/I_C=(C*2\ V)/(18\ \mu A/V*V_{sd})$. The capacitor 330 in this particular embodiment is a 0.47 microfarad (µF) ceramic capacitor, but may be adjusted as desired based, for example, on the time the power is to be limited in, the currents and voltages in the MOSFET power transistor 240 and the voltage to current ratio in the controlled current source 315.

The voltage on the capacitor 330 is compared with a reference voltage from a constant voltage source 335 by a comparator 340. When the voltage on the capacitor 330 becomes greater than the reference voltage, for example greater than 2 V, the output 345 of the comparator 340 is asserted and is fed back to the current regulator 270 to shut off the current through the MOSFET power transistors 235 and 240.

Again, the controlled current source 315 only charges the capacitor 330 when the status output 325 from the current regulator 270 indicates that the current is being regulated in the MOSFET power transistors 235 and 240. If the current level through the MOSFET power transistors 235 and 240 drops and the current regulation condition ends, the status output 325 from the current regulator 270 becomes inactive. A constant current source 350 acts as a current sink to discharge the capacitor 330 when the current through the MOSFET power transistors 235 and 240 is not being regulated. An enable signal 355 on the constant current source 350 is connected through an inverter 360 to the status output 325 from the current regulator 270. Thus, the capacitor 330 is always either being charged by the controlled current source 315 or discharged if any charge remains by the constant current source 350. Note that intermittent and recurring faults in the system may cause the system to go in and out of current regulation. The capacitor 330 provides a memory function that integrates the power dissipation in the MOSFET power transistors 235 and 240 over time. For example, if the system is in current regulation long enough to charge the capacitor 330 to 1.5 V, then is out of current regulation long enough to discharge the capacitor 330 by 0.5 V, and is then in current regulation again long enough to add just over another 1.0 V to the capacitor 330, the power will have reached the limit and the current through the MOSFET power transistors 235 and 240 will be shut off. Thus, even if the system is not in a current regulation state for a long period of time, the power dissipated in the MOSFET power transistors 235 and 240 continues to be monitored over time and current through the MOSFET power transistors 235 and 240 can be switched off if the power over time exceeds the limit. This prevents the MOSFET power transistors 235 and 240 from overheating and being damaged by intermittent and recurring faults in the system. In one particular embodiment, the constant current source 350 generates a constant 5 µA current when enabled. In another embodiment, the constant current source 350 generates a constant 1 µA current when enabled. The current from the constant current source 350 may be set at the desired level based on how quickly the MOSFET power transistors 235 and 240 recover from high current situations. This is based, for example, on factors such as the power rating of the transistors and the cooling capacity of the system.

In the particular embodiment illustrated in FIG. 4, a latch 365 is connected to the output 345 of the comparator 340 so that once the system is shut down due to an over-power condition, it remains shut down until the AC adapter is removed and reconnected to the AC adapter input 245. The conditions required to restart the system may be selected as desired and may generate a signal 370 that is connected to the reset input of the SR latch 365. For example, the system may operate on battery power during an over-power shutdown of the AC adapter power system, and in this case, a comparator may be used to compare the voltage on the source 300 of the MOSFET power transistor 240 with the voltage from the battery. Once the voltage on the source 300 has dipped below the battery voltage and risen back up, indicating that the AC adapter has been removed and reconnected to the AC adapter input 245, the signal 370 may be asserted to reset the latch 365 and allow current to flow once again through the MOSFET power transistors 235 and 240.

The output 345 from the comparator 340 in the particular embodiment of FIG. 4 is asserted when power is to be shut down. The output 375 from the latch 365 is taken from the inverted output so that when the switch enable signal 380 that feeds back to the current regulator 270 is asserted, current is allowed to flow through the MOSFET power transistors 235 and 240, and when the switch enable signal 380 is not asserted, indicating an over-power condition, the system is shut down. Note that the way in which signals are represented and encoded in the apparatus for limiting power is not limited to the exemplary embodiments disclosed herein. For example, any digital signal may be encoded as an active low or active high signal, etc, and any variation on the way in which the signals are represented are equivalent and do not depart from the inventive concepts disclosed herein.

A delay may be added in the power monitoring and regulation portion of the apparatus for limiting power dissipation, preventing the MOSFET power transistors 235 and 240 from turning on immediately after an AC adapter is connected to the AC adapter input 245. A delay circuit 385 asserts a signal 390 only a predetermined amount of time after an AC adapter is connected to the AC adapter input 245, for example after 500 milliseconds (ms) or 700 ms. This delay signal 390 is combined with the latch output 375 in an AND gate 395, preventing the output 400 from the AND gate 395 from being asserted immediately after power on. The switch enable signal 380 is thus kept inactive for the delay period, such as 700 ms, causing the system to run on battery power and keeping the power on the AC adapter input 245 disconnected while the adapter voltage settles. After the delay, the signal 390 is asserted and the output 400 of the AND gate 395 is allowed to become active as long as no over-power condition has been stored in the latch 365.

An additional delay circuit may be included preventing the system from entering and latching an over-power condition immediately upon power on. Note that during the 700 ms delay, the capacitor 330 is still allowed to charge during current regulation and that if the limit is reached, the latch 365 will store the error condition. In this case, the MOSFET power transistors 235 and 240 will not be allowed to turn on after the 700 ms delay period. A small additional delay period may be added, such as a 2 ms delay after the AC adapter is connected to the AC adapter input 245, during which the power monitoring circuitry is either prevented from charging the capacitor 330 or from latching a detected over-power condition. For example, the status output 325 from the current regulator 270 may be kept inactive during the 2 ms delay using a delay circuit (not shown) placed in series with the status output 325. In another embodiment, the delay circuit (not shown) may be placed between the output 345 of the comparator 340 and the S input of the latch 365. In this particular embodiment, even if the capacitor 330 charges to the limit immediately after an AC adapter is connected to the AC adapter input 245 as parasitic capacitances and inductances are charged in the system, the delay allows the power to settle and current to drop to more normal levels. This delay should be set to a sufficient duration so that if the system initially enters an over-power condition, there is time after the initial inrush of current settles for the capacitor 330 to discharge below the limit through constant current source 350 before the over-power indication from the comparator 340 can be stored in the latch 365. Note, however, that power monitoring is still occurring during this delay period, and if a more serious fault condition exists than the normal inrush current during power on, the capacitor 330 would retain its charge and the over-power condition would be latched after the brief initial delay and the MOSFET power transistors 235 and 240 would not be allowed to turn on after the 700 ms delay period established by the first delay circuit 385. For these various embodiments including additional power-on delays to function, the voltage feedback from the MOSFET power transistor 240 must continue to operate. Adaptations to the configuration of the transistors 235 and 240 and the voltage feedback connections may be made as needed so that the voltage feedback from the MOSFET power transistor 240 continues to operate during this additional delay period.

A break-before-make circuit 405 may be included in the switch enable signal 380 to ensure that the current from the AC adapter input 245 is interrupted before a battery (not shown) is connected to the load. More generally, this circuit 405 may be used to disconnect any other power sources before an AC adapter is used to power the system through the AC adapter input 245, and vice versa. The break-before-make circuit 405 may include any suitable hysteresis logic or delay chains to prevent multiple power sources from being connected to the load simultaneously.

Figure 5:
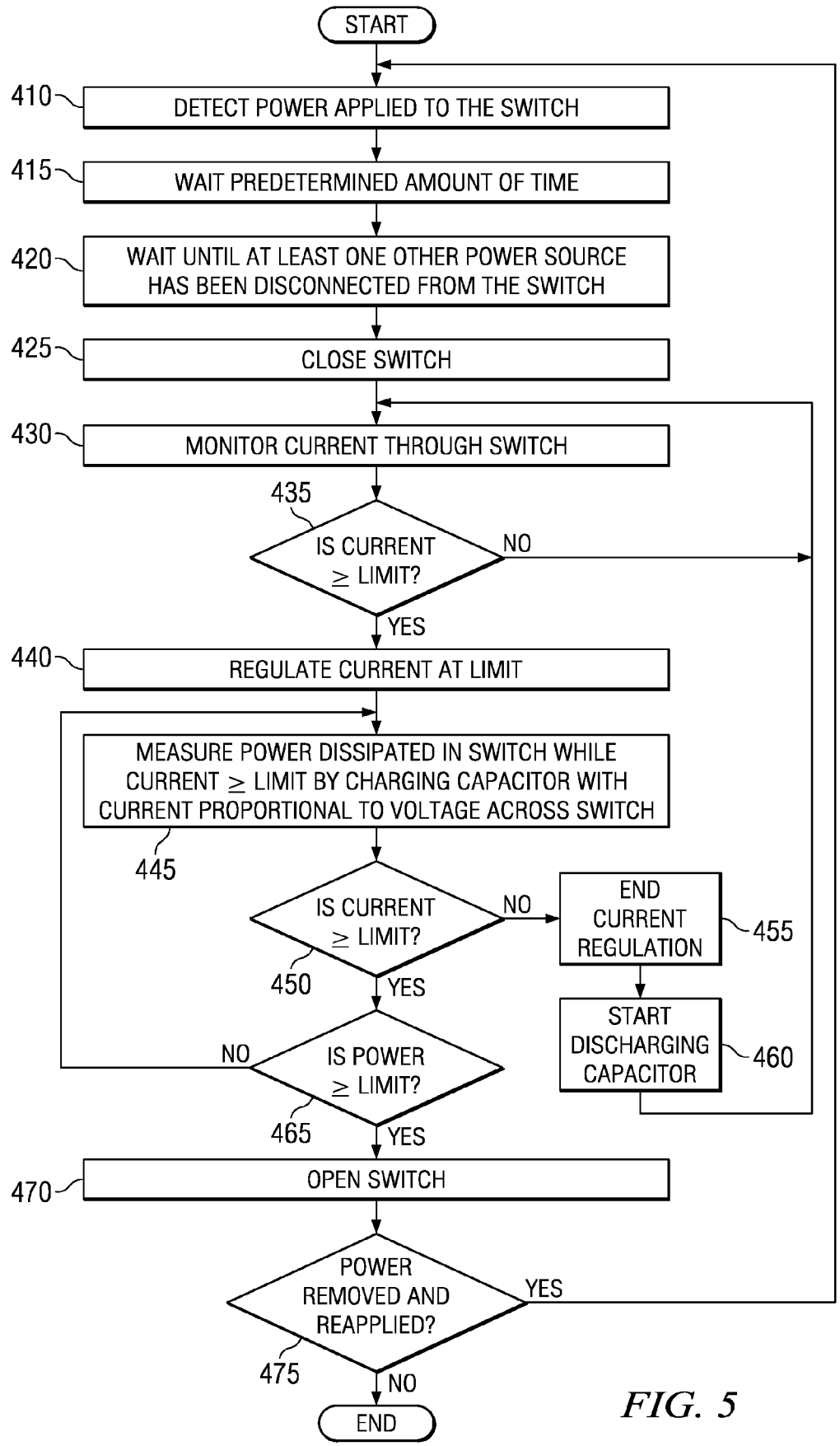
FIG. 5 is a flow chart of an exemplary operation for limiting power dissipation in a switch.

Turning now to FIG. 5, a method for limiting power dissipation will be described. This method may be implemented in a circuit such as that illustrated in FIG. 4, or in any other suitable circuitry or processor executable code. Power is detected at the input to the switch (block 410), and a predetermined delay is provided for the power to settle (block 415). A delay may also be provided to allow any other power source to be disconnected (block 420), and the switch is then closed to allow current to flow through the switch (block 425). Current is monitored through the switch (block 430) and is compared with a current limit (block 435). If the current through the switch reaches the current limit, the current through the switch is regulated to prevent it from exceeding the limit (block 440). While the current is being regulated, the power dissipated in the switch is measured by charging a capacitor with a current that is proportional to the voltage across the switch (block 445). The current continues to be compared with the current limit (block 450), and if it drops below the limit, current regulation is ended (block 455) and the capacitor begins to discharge (block 460). Current monitoring then continues for future over-current conditions (block 430). If the current remained at the limit (block 450), and if the power dissipated in the switch reaches a predetermined power limit (block 465), the switch is opened to turn off the current (470). This allows the switch to cool down and prevents permanent damage to the switch while the cause of the over-current condition can be addressed. Before the switch can be closed again, power must be removed and reapplied to the switch (block 475).

In conclusion, the present invention provides novel systems, apparatuses and methods for limiting power dissipation in a switch. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for limiting power dissipation across a switch, comprising:
   a switch having a power supply input, a load power output, a switch control input, a current level through the switch output and a voltage level across the switch output;
   a current regulator having a current level through the switch input, a current regulation output, a power meter enable output and a power shutoff input, the current level through the switch input being connected to the current level through the switch output from the switch and the current regulation output being connected to the switch control input; and
   a power meter for the switch having a voltage level across the switch input, an enable input and a power shutoff output, the voltage level across the switch input being connected to the voltage level across the switch output from the switch, the enable input being connected to the current regulator power meter enable output, and the power shutoff output being connected to the current regulator power shutoff input, wherein the current regulator limits the current through the switch to a predetermined level and the power meter determines if power dissipation by the switch exceeds a predetermined level when the current regulator is limiting the current level through the switch by measuring a quantity related to the voltage level across the switch over time.

2. The apparatus of claim 1, the current regulator further comprising a reference current level input, wherein the current regulator power meter enable output is active when a current level through the switch as indicated on the current regulator switch current level input is at least as great as a reference current level as indicated on the reference current level input.

3. The apparatus of claim 1, the power meter further comprising a reference input, wherein the power shutoff output is active when an amount of power dissipated through the switch is at least as great as a limit level as indicated on the reference input, and wherein the amount of power dissipated is measured by the power meter based at least in part on the switch voltage level input and the power meter enable input.

4. The apparatus of claim 3, wherein the power meter comprises a capacitor, a controlled current source, a current sink and a comparator, the controlled current source having a control input being connected to the voltage level across the switch input, wherein the controlled current source generates an output current that is proportional to a voltage across the switch, the controlled current source having an enable input connected to the power meter enable input, the capacitor being connected to an output of the controlled current source and to the current sink, the current sink having a disable input connected to the power meter enable input, the power meter comparator having a first input connected to the capacitor and a second input connected to the power meter reference input and an output connected to the power meter power shutoff output.

5. The apparatus of claim 1, wherein the switch comprises at least one MOSFET.

6. The apparatus of claim 1, further comprising a delay circuit being connected between the power meter and the current regulator, the delay circuit having an input connected to the power meter power shutoff output and an output connected to the current regulator power shutoff input, wherein the delay circuit holds the power shutoff signal active for a predetermined period of time after power is detected at the switch power supply input.

7. The apparatus of claim 1, further comprising a latch being connected between the power meter and the current regulator for keeping the power meter power shutoff output activated once it has been activated until power has been removed from the switch power supply input, the latch having an input connected to the power meter power shutoff output and an output connected to the current regulator power shutoff input.

8. The apparatus of claim 1, further comprising a break-before-make circuit being connected between the power meter and the current regulator, the break-before-make circuit having an input connected to the power meter power shutoff output and an output connected to the current regulator power shutoff input.

9. The apparatus of claim 1, the switch further comprising a current sense resistor and differential amplifier, the current sense resistor being connected in series with the switch load power output, the differential amplifier having a first input, a second input and an output, the first input being connected to an input of the current sense resistor, the second input being connected to an output of the current sense resistor and the output being connected to the switch current level output.

10. A system for limiting power dissipation, comprising:
a portable computer and an AC adapter that is connectable to a power supply input on the portable computer, the portable computer comprising a power supply and a power distribution network connected to an output of the power supply, the power supply comprising an adapter control system and a battery, the battery being switchably connected to the power supply output, the adapter control system comprising:

a switch having a power input, a power output and a switch control input, the power input being connected to the power supply input;
a current monitor comprising a current sense resistor and a differential amplifier, the current sense resistor having an input and an output, the input being connected to the switch power output and the output being connected to the power supply output, the differential amplifier having a first input and a second input, the first input being connected to the current sense resistor input and the second input being connected to the current sense resistor output;
a voltage monitor comprising a differential amplifier having a first input and a second input, the first input being connected to the switch power input and the second input connected to the switch power output;
a reference current amplifier with a maximum current limit and having an input connected to a user-supplied current reference level;
a current regulator having a current regulation output, a first current input, a second current input, a power meter enable output and a switch enable input, the current regulation output being connected to the switch control input, the first current input being connected to an output of the current monitor, the second current input being connected to an output of the reference current amplifier, wherein when the switch enable input is inactive the current regulation output is configured to open the switch;
a power meter comprising a capacitor, a controlled current source, a current sink, a comparator and a reference voltage source, the controlled current source having a control input being connected to an output of the voltage monitor differential amplifier, wherein the controlled current source generates an output current that is proportional to a voltage detected by the voltage monitor, the controlled current source having an enable input connected to the current regulator power meter enable output, the capacitor being connected to an output of the controlled current source and to the current sink, the current sink having a disable input connected to the current regulator power meter enable output, the capacitor being connected to a first input of the power meter comparator, the reference voltage source being connected to a second input of the power meter comparator;
a latch having an input and an output, the input being connected to an output of the power meter comparator;
a delay circuit having an input and an output, the input being connected to the latch output; and
a break-before-make circuit having an input connected to the delay circuit output, an output connected to the current regulator switch enable input and a connection to a battery switch, wherein the break-before-make circuit prevents the adapter control system switch and the battery switch from connecting to the power distribution network simultaneously.

* * * * *